US008106430B2

(12) United States Patent
Cho et al.

(10) Patent No.: US 8,106,430 B2
(45) Date of Patent: Jan. 31, 2012

(54) PREPARATION OF THIN FILM TRANSISTORS (TFTS) OR RADIO FREQUENCY IDENTIFICATION (RFID) TAGS OR OTHER PRINTABLE ELECTRONICS USING INK-JET PRINTER AND CARBON NANOTUBE INKS

(75) Inventors: Gyou-Jin Cho, Chonnam (KR); Min Hun Jung, Chonnam (KR); Jared L. Hudson, Hamilton, VA (US); James M. Tour, Bellaire, TX (US)

(73) Assignee: William Marsh Rice University, Houston, TX (US)

( * ) Notice: Subject to any disclaimer, the term of this patent is extended or adjusted under 35 U.S.C. 154(b) by 0 days.

(21) Appl. No.: 12/881,778

(22) Filed: Sep. 14, 2010

(65) Prior Publication Data
US 2011/0079770 A1    Apr. 7, 2011

Related U.S. Application Data

(62) Division of application No. 12/094,960, filed as application No. PCT/US2006/045388 on Nov. 24, 2006, now Pat. No. 7,821,079.

(60) Provisional application No. 60/739,666, filed on Nov. 23, 2005, provisional application No. 60/775,060, filed on Feb. 21, 2006.

(51) Int. Cl.
*H01L 29/76*    (2006.01)
(52) U.S. Cl. .............. 257/288; 257/613; 257/E51.038; 257/E21.049; 438/151; 438/197; 438/478; 977/847; 977/938
(58) Field of Classification Search .................. None
See application file for complete search history.

(56) References Cited

U.S. PATENT DOCUMENTS

| | | | |
|---|---|---|---|
| 6,921,575 B2 * | 7/2005 | Horiuchi et al. | 428/367 |
| 7,091,096 B2 * | 8/2006 | Balasubramanian et al. | 438/292 |
| 7,226,818 B2 * | 6/2007 | Malenfant et al. | 438/149 |
| 2004/0099438 A1 * | 5/2004 | Arthur et al. | 174/257 |

(Continued)

FOREIGN PATENT DOCUMENTS
WO    WO 2004001860 A1 * 12/2003

(Continued)

OTHER PUBLICATIONS

Hur et al., Nanotransfer printing by use of noncovalent surface forces: Applications to thin-film transistors that use single-walled carbon nanotube networks and semiconducting polymers, Appl. Phys. Lett., 2004, 85, 5730-5732.*

(Continued)

*Primary Examiner* — Evan Pert
*Assistant Examiner* — Andres Munoz
(74) *Attorney, Agent, or Firm* — Winstead PC

(57) ABSTRACT

The invented ink-jet printing method for the construction of thin film transistors using all SWNTs on flexible plastic films is a new process. This method is more practical than all of existing printing methods in the construction TFT and RFID tags because SWNTs have superior properties of both electrical and mechanical over organic conducting oligomers and polymers which are often used for TFT. Furthermore, this method can be applied on thin films such as paper and plastic films while silicon based techniques cannot be used on such flexible films. These are superior to the traditional conducting polymers used in printable devices since they need no dopant and they are more stable. They could be used in conjunction with conducting polymers, or as stand-alone inks.

4 Claims, 6 Drawing Sheets

U.S. PATENT DOCUMENTS

| | | | |
|---|---|---|---|
| 2005/0030181 A1* | 2/2005 | Mickle et al. | 340/572.7 |
| 2005/0062034 A1* | 3/2005 | Dubin | 257/20 |
| 2006/0065887 A1* | 3/2006 | Tiano et al. | 257/20 |
| 2006/0124028 A1* | 6/2006 | Huang et al. | 106/31.92 |

FOREIGN PATENT DOCUMENTS

| | | |
|---|---|---|
| WO | WO 2004032193 A2 * | 4/2004 |

OTHER PUBLICATIONS

Lefenfeld et al., High-Performance Contacts in Plastic Transistors and Logic Gates That Use Printed Electrodes of DNNSA-PANI Doped with Single-Walled Carbon Nanotubes, Adv. Mater., 2003, 15, 1188-1191.*

Hines et al., Nanotransfer printing of organic and carbon nanotube thin-film transistors on plastic substrates, Appl. Phys. Lett., 2005, 86, 163101.*

Blanchet et al., Polyaniline nanotube composites: A high-resolution printable conductor, Appl. Phys. Lett., 2003, 82, 1290-1292.*

Meitl et al., Solution Casting and Transfer Printing Single-Walled Carbon Nanotube Films, Nano Lett., 2004, 4, 1643-1647.*

Dyke, C. A.; Stewart, M. P.; Tour, J. M. ,Separation of Single-Walled Carbon Nanotubes on Silica Gel. Materials Morphology and Raman Excitation Wavelength Affect Data Interpretation, J. Am. Chem. Soc. 2005, 127, 4497-4509.*

Hudson, J. L.; Casavant, M. J.; Tour, J. M.,Water-Soluble, Exfoliated, Nonroping Single-Wall Carbon Nanotubes, J. Am. Chem. Soc. 2004, 126, 11158-11159.*

Dyke, C. A.; Tour, J. M., Feature Article: Covalent Functionalization of Single-Walled Carbon Nanotubes for Materials Applications, J. Phys. Chem. A. 2004, 108, 11151-11159.*

Strano, M. S.; Dyke, C. A.; Usrey, M. L.; Barone, P. W.; Allen, M. J.; Shan, H.; Kittrell, C.; Hauge, R. H.; Tour, J. M.; Smalley, R. E., Electronic Structure Control of Single Walled Carbon Nanotube Functionalization, Science 2003, 301, 1519-1522.*

Novak et al., Macroelectronic applications of carbon nanotube networks, Solid State Elect., 48:2004, pp. 1753-17556.*

Artukovic et al., Transparent and flexible carbon nanotube transistors, Nano Lett., 5:2005, pp. 757-760.*

Lee et al., Organic thin film transistor with carbon nanotube electrodes, AIP Conf. Proc., 786:2005, pp. 508-511.*

* cited by examiner

PREPARATION OF THIN FILM TRANSISTORS (TFTS) OR RADIO FREQUENCY IDENTIFICATION (RFID) TAGS OR OTHER PRINTABLE ELECTRONICS USING INK-JET PRINTER AND CARBON NANOTUBE INKS

CROSS-REFERENCE TO RELATED APPLICATIONS

This application is a divisional application of U.S. patent application Ser. No. 12/094,960, filed Nov. 13, 2008, now U.S. Pat. No. 7,821,079 which is a 35 U.S.C. §371 national stage application of international application PCT/US2006/045388, filed Nov. 24, 2006, which claims the priority of U.S. Provisional Patent Applications 60/739,666, filed Nov. 23, 2005, and 60/775,060 filed Feb. 21, 2006. Each of the aforementioned priority applications is incorporated by reference herein in its entirety.

STATEMENT REGARDING FEDERALLY-SPONSORED RESEARCH

This invention was made with Government support under grant number N00014-04-1-0765 awarded by the U.S. Department of Defense. The Government has certain rights in the invention.

FIELD OF THE INVENTION

The present invention relates generally to printable electronics, more particularly to printable electronics made using ink jet printers and carbon nanotube inks.

BACKGROUND

As the demand for ubiquitous electronics is largely consumer driven, in some fields factors such as disposability, low cost and massive market applications are tending to become more important than ultrapowerful microelectronic devices. Therefore, macroelectronic devices that are light, inexpensive, flexible, disposable, and minimally sufficient to execute the simple task at hand are in high demand. Inexpensive radio frequency identification tags, flexible displays, disposable cell phones and e-papers are among the potential applications of such devices. To make practical use of these applications, it is desirable that their components are prepared using simple and inexpensive means that do not require using high vacuum deposition or photolithography facilities.

SUMMARY

The invented ink-jet printing method for the construction of thin film transistors using all SWNTs on flexible plastic films is a new process. This method is more practical than all of existing printing methods in the construction TFT and RFID tags because SWNTs have superior properties of both electrical and mechanical over organic conducting oligomers and polymers which often used for TFT. Furthermore, this method can be applied on thin films such as paper and plastic films while silicon based techniques can not used on such flexible films. These are superior to the traditional conducting polymers used in printable devices since they need no dopant and they are more stable. They could be used in conjunction with conducting polymers, or as stand-alone inks.

According to some embodiments, a process is disclosed for making thin film (TF) electronic devices comprising the steps of: using an ink jet printer mechanism to print electronic device patterns on a substrate as a composite ink mixture of metallic carbon nanotubes (m-NTs) and semiconductor carbon nanotubes (s-NTs), wherein the m-NTs are active and dominate the characteristics of the composite ink mixture in any of the electronic device patterns designated as a conductor patterns; de-activating a portion of the m-NTs in any of the electronic device patterns designated as resistive device patterns; and de-activating substantially all of the m-NTs in any of the electronic patterns designated as semiconducting device patterns.

According to some embodiments, a thin film electronic circuit comprises a circuit formed on a substrate to have a pre-determined functionality requiring conductors interconnecting a plurality of resistive devices, capacitive devices, inductive devices, and active semiconductor devices, wherein the conductors, the resistive devices, the capacitive devices, the inductive devices, and the active semiconductor devices are formed at least in part by the process of: using an ink jet printer mechanism to print electronic device patterns, on a substrate, as a composite ink mixture of metallic carbon nanotubes (m-NTs) and semiconductor carbon nanotubes (s-NTs), wherein the m-NTs are active and dominate the characteristics of the composite ink mixture in any of the electronic device patterns designated as the conductors; de-activating a portion of the m-NTs of the composite ink mixture in any of the electronic device patterns designated as the resistive devices; and de-activating substantially all of the m-NTs of the composite ink mixture in any of the electronic patterns designated as a semiconducting portion of the active semiconductor devices.

According to some embodiments, a thin film transistor (TFT) comprises: a channel fabricated as a first layer of a composite ink mixture of metallic carbon nanotubes (m-NTs) and semiconductor carbon nanotubes (s-NTs) applied to a substrate, wherein the m-NTs dominate the characteristics of the composite ink mixture and are de-activated in-situ to render the channel a semiconductor channel layer; a gate area fabricated by applying a dielectric layer over a portion of the semiconductor channel layer while exposing a source area and a drain area on the semiconductor channel layer; and a gate electrode, a source electrode and a drain electrode fabricated as electrode layers of the composite ink mixture applied to the gate area, the source area, and the drain area, wherein the m-NTs of the composite ink mixture of the electrode layers are not de-activated thus rendering the electrode layers of the composite ink mixture substantially conductive, wherein a conductivity of the channel is modulated in response to voltage applied to the gate electrode.

The foregoing has outlined rather broadly the features and technical advantages of a number of embodiments of the present invention in order that the detailed description of the present invention that follows may be better understood. Additional features and advantages of the invention will be described hereinafter.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
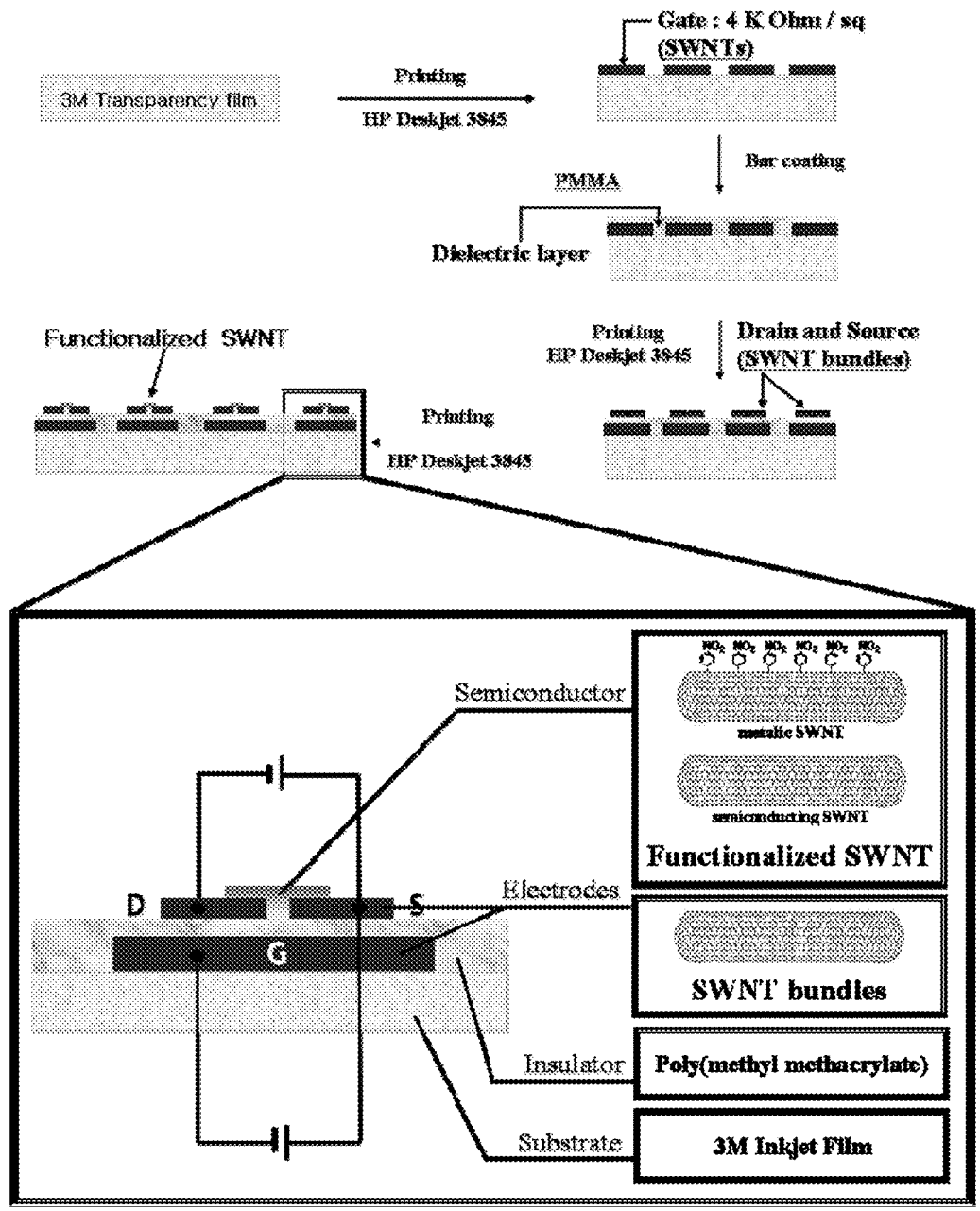
FIG. 1 shows a schematic of an exemplary process of fabricating SWNT TFTs using a commercial ink-jet printer for the electrode and active layer printing.

The invented ink-jet printing methods described herein for the construction of thin film transistors (TFTs) and radio-frequency identification (RFID) tags, using entirely single-walled carbon nanotubes (SWNTs) on flexible plastic films, is a new process. The methods of the present invention are more practical than prior art printing methods in the construction of TFTs and RFID tags because SWNTs have superior electrical and mechanical properties over organic conducting oligomers and polymers—which are often used for TFTs. Furthermore, this method can be applied on thin films such as paper and plastic films while silicon-based techniques cannot be used on such flexible films. These are superior to the traditional conducting polymers used in printable devices since they need no dopant and they are more stable. They could be used in conjunction with conducting polymers, or as stand-alone inks.

Ink-jet printing methods have been used previously to construct TFTs with poor performance (<0.06 cm²/Vs) from conducting and semiconducting polymer solutions. However, there are no reports of TFTs printed using all-SWNTs on flexible plastic substrates. Here, we used an inexpensive commercially available inkjet printer (HP Deskjet 3845) to print TFTs containing SWNTs on 3M transparency film (CG3460) with precise control over the density and position. The major reason for using the commercial ink-jet printer and flexible plastic films is to show how SWNTs are robust and give consistent values for printed devices under ambient conditions.

While efforts have been made to print carbon nanotube-based films for use in TFTs or other electronic devices, such efforts possess many limitations. See, e.g., Hur et al., "Nanotransfer printing by use of noncovalent surface forces: Applications to thin-film transistors that use single-walled carbon nanotube networks and semiconducting polymers," *Appl. Phys. Lett.*, 2004, 85, 5730-5732; Lefenfeld et al., "High-Performance Contacts in Plastic Transistors and Logic Gates That Use Printed Electrodes of DNNSA-PANI Doped with Single-Walled Carbon Nanotubes," *Adv. Mater.*, 2003, 15, 1188-1191; Hines et al., "Nanotransfer printing of organic and carbon nanotube thin-film transistors on plastic substrates," *Appl. Phys. Lett.*, 2005, 86, 163101; Blanchet et al., "Polyaniline nanotube composites: A high-resolution printable conductor," *Appl. Phys. Lett.*, 2003, 82, 1290-1292; and Meitl et al., "Solution Casting and Trasfer Printing Single-Walled Carbon Nanotube Films," *Nano Lett.*, 2004, 4, 1643-1647.

With regard to the present invention, the unique aspect about the technique described herein is the deactivation (lowering of the conductivity) of the metallic SWNTs by functionalization of the mixed SWNT samples. By employing such deactivation, none of the functionalized SWNTs need to be removed from the sample. They can be left in the sample. The semiconductor tubes then dominate the properties of the active (semiconductive) layers. It may be that the functionalization of the metallics causes them to become poor conductors or themselves semiconductors; regardless of their properties, as long as the metallics lose their metallic character, the overall sample is useful as the active layer. None of the other above-cited published works covalently functionalize the SWNTs in order to modulate their conductive properties and thereby render them useful as active layers.

We detail herein new ways to address the obstacles involved in using a combination of SWNT inks and an ink jet method. (Herein, the prefix "m" denotes metallic in conductive properties, and the prefix "s" denotes semiconducting in conductive properties, and that which is applied to TFTs could likewise be applied to RFID tags and other printable structures). In principle, if we could make pure m-SWNTs and pure s-SWNTs, we could use m-SWNT to fabricate the electrodes (i.e., source, drain and/or gate) of the TFTs and s-SWNTs to fabricate the active layer (semiconductive layer between the source-drain and above the dielectric layer) of the TFTs. Note that we have also made dielectric layers from heavily fluorine-functionalized SWNTs, but they were unstable, hence we use more conventional dielectrics, such as PMMA for that layer. Since SWNTs in general are known to have a strong affinity for plastic surfaces and for other SWNTs, printed coatings containing either m-SWNTs or s-SWNTs should adhere both to the substrate and to each other. However, methods for reliably producing or segregating pure m-SWNTs from s-SWNTs have yet to be developed. Hence, in this work we used the native mixture of SWNTs (mixture of the metallic and semiconductors wherein the metallic dominate the behavior) for the electrodes and a product enriched in s-SWNTs (ps-SWNTs), prepared by selective functionalization (see, e.g., Dyke, C. A.; Stewart, M. P.; Tour, J. M. "Separation of Single-Walled Carbon Nanotubes on Silica Gel. Materials Morphology and Raman Excitation Wavelength Affect Data Interpretation," *J. Am. Chem. Soc.* 2005, 127, 4497-4509; Hudson, J. L.; Casavant, M. J.; Tour, J. M. "Water-Soluble, Exfoliated, Nonroping Single-Wall Carbon Nanotubes," *J. Am. Chem. Soc.* 2004, 126, 11158-11159; Dyke, C. A.; Tour, J. M. "Feature Article: Covalent Functionalization of Single-Walled Carbon Nanotubes for Materials Applications," *J. Phys. Chem. A.* 2004, 108, 11151-11159; Strano, M. S.; Dyke, C. A.; Usrey, M. L.; Barone, P. W.; Allen, M. J.; Shan, H.; Kittrell, C.; Hauge, R. H.; Tour, J. M.; Smalley, R. E. "Electronic Structure Control of Single Walled Carbon Nanotube Functionalization," *Science* 2003, 301, 1519-1522) for the active layer. Finally, unlike typical conducting polymers, SWNTs are inherently conductive and require no dopants.

In an exemplary embodiment, for the fabrication of electrodes of a TFT, 0.37 g of crude SWNT bundles (HiPco) are dispersed in 1 L of water/SDS (10 g) using an ultrasonic homogenizer (Polyscience X-520, 750-Watt) for 1 h; then to 20 mL of the dispersion is added 2 mL decanol (water to decanol 10:1 ratio), and the decanol is mixed with the dispersed SWNT bundles under sonication for 30 min using an ultrasonic cleaner (Cole-Parmer: B3-R). The resulting mixtures are filtered (cotton-packed column) to remove aggregated SWNTs, and the filtrate is used as a conducting ink. The gate electrodes are printed on the transparent film by using the ink-jet printer with the cartridge refilled by the prepared SWNTs ink. To attain the lowest surface resistance for printed electrodes, the deposition cycle (printing, drying, and washing with ethanol to remove the surfactant and decanol) is repeated 10 times. The printed gate electrodes have a surface resistance of 4 KΩ/sq, which is the lowest surface resistance obtained with given SWNTs and our printing system. As shown in atomic force microscopy (AFM) images of the gate electrode, SWNT bundles are well-packed and well-adhered on the surface so that it is difficult to remove even by the Scotch™ tape test.

The gate dielectric layer is then coated on the gate using a solution containing 1 g of poly(methyl methacrylate) ($M_w$ 120,000) in 10 mL of 2-butanone and a bar coater. The PMMA-coated film is annealed for 2 h at 110-120° C. under ambient conditions and then the drain and source electrodes are printed on the film using the same conducting SWNTs ink and same printing cycles (10 times). Since our printing system has a maximum resolution of 300 μm, the channel length of the all-SWNT-TFTs are printed at 800 μm to prevent a short between the drain and source electrodes. The surface resistance of the printed drain, source, and gate electrodes are approximately equivalent.

For the deposition of ps-SWNTs as the active layer, we first prepare ps-SWNTs by selectively reacting the m-SWNTs from an aqueous dispersion of individual SWNTs (crude HiPco, 0.07 g/L). Since the HiPco process affords samples containing ca. 50 different tube types with ca. one third of m-SWNT and two thirds of s-SWNT, we need to enrich s-SWNT from the solution through the selective deactivation of m-SWNT. Since we previously showed the p-nitrobenzenediazonium tetrafluoroborate can preferentially react with m-SWNTs, we can deactivate them to some degree via the surface functionalization reaction. When functionalized, the m-SWNTs are assumed to be poor conductors. The selective functionalization of m-SWNT is monitored by UV/vis/NIR to confirm the reduction of intensity for van Hove singularities.

The solution of ps-SWNT is formulated with water/decanol as before. The active layer, with a width of 2600 μm and channel length of 800 μm, is printed 5 times following the same printing cycles (printing, drying, and washing with ethanol to remove surfactant and decanol) as the electrodes except using the ps-SWNT ink.

All electrical measurements for printed SWNT-TFT are carried out under ambient conditions using a semiconductor parameter analyzer (Agilent 4155C).

The methods of the present invention can be directly used in the field of inexpensive plastic radio frequency identification (RFID) tags as well as TFTs. By employing such methods, the cost of each RFID tag can be reduced to 1 cent or less because passivation processes and lithographic methods are not required. Furthermore, if the on-off ratio of printed TFT using the invented method could be improved up to $10^6$, this method will be applied to construct macroelectronic devices such as e-paper, organic light emitting display, and disposable cellular phone.

We used an inexpensive commercially available inkjet printer (HP Deskjet 3845) to print TFTs containing SWNTs on 3M transparency film (CG3460) with precise control over the density and position. The major reason for using the commercial ink-jet printer and flexible plastic films is to show how SWNTs are robust and give consistent values for printed devices under ambient conditions. A higher quality printer would permit finer structures.

This invention has advantages of very high mobility of 296 $cm^2V^{-1}s^{-1}$ with a transconductance of 49.3 μS which would not be attained using existing printing methods. Furthermore, TFTs printed using this method have stable electrical properties under ambient condition without any passivation because SWNTs do not need dopants to show desired electrical properties.

The underscoring novelty is in the use of SWNTs for both the electrodes and the active layers by simply taking the bulk SWNTs and either using them directly for the electrodes (but as soluble species in surfactant-wrapped form) or the ps-SWNTs which are enriched in semiconductors (metallics having been suppressed by functionalization) in alcohol- or water soluble forms (such as aryl sulfonic acids or aryldicarboxylic acid functionalized SWNTs).

The low on-off ratio of printed TFT is the only disadvantage of using the invented method. However, the disadvantage can be overcome by using purer semiconducting SWNTs in the active layer where much more of the metallics have been rendered non-metallic by functionalization.

In terms of variations, the printed TFTs using the invented method can have two different structures such as top active layer or top source-drain structures. In addition, SWNT electrodes can be replaced by metals, and semiconductors as the active layer can be changed to conducting oligomers or polymers. Finally, while the discussion herein has focused on SWNTs, such methods could be modified to utilize other types of carbon nanotubes instead of, or in addition to, SWNTs. Suitable other types of carbon nanotubes include, but are not limited to, multi-wall carbon nanotubes, double-wall carbon nanotubes, small-diameter (<3 nm) carbon nanotubes, and combinations thereof. Also, wrapping nanotubes in nonionic surfactants, such as pluronics, can cause them to act as excellent inks in this process. Finally, Applicants have recently found that polyethylene glycol can be added to the SWNT inks to serve as an excellent co-additive for the uniform inking of substrates with pristine or functionalized SWNT solutions.

The following examples are included to demonstrate particular embodiments of the present invention. It should be appreciated by those of skill in the art that the methods disclosed in the examples that follow merely represent exemplary embodiments of the present invention. However, those of skill in the art should, in light of the present disclosure, appreciate that many changes can be made in the specific embodiments described and still obtain a like or similar result without departing from the spirit and scope of the present invention.

EXPERIMENTAL EXAMPLES

Example 1

SWNT TFT: This example illustrates TFT results wherein very high mobilities were obtained. The results contained in this example were reported in Appendix A of the priority documents, U.S. Provisional Application Ser. No. 60/739,666 U.S. Provisional Application Ser. No. 60/775,060. The aforementioned Appendix A is a reproduction of a manuscript pre-print. This manuscript preprint has not been published.

FIG. 1 shows a schematic of an exemplary process of fabricating SWNT TFTs using a commercial ink-jet printer for the electrode and active layer printing. The electrodes are SWNT bundles of m-SWNTs and s-SWNTs. The active layer is made from ps-SWNTs obtained using functionalization procedures. Gate dielectric layers are coated on printed gate electrodes using a bar coater.

Figure 2:
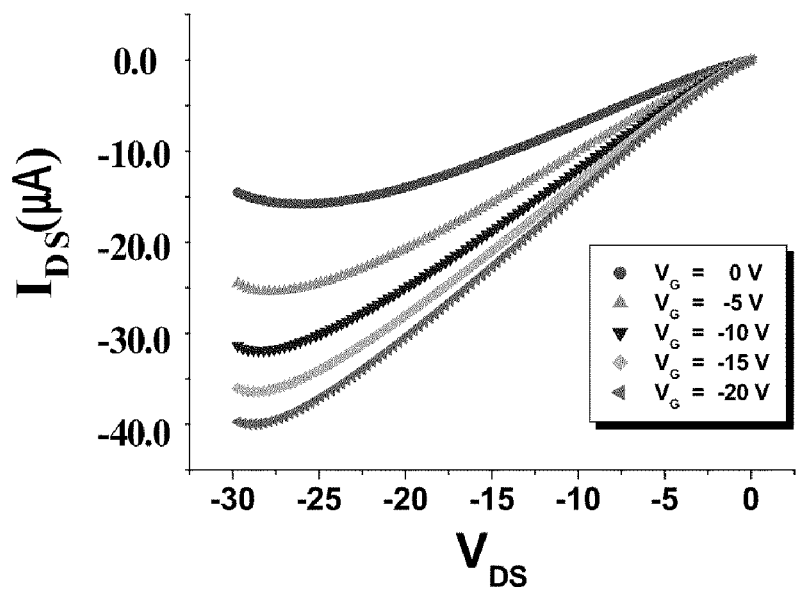
FIG. 2 shows I-V characteristics of a printed all-SWNT-TFT.
Figure 3:
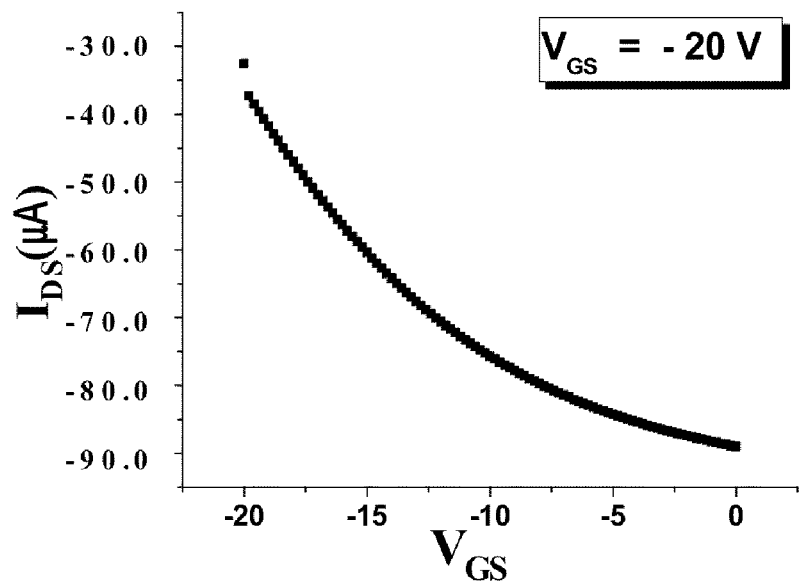
FIG. 3 shows transfer characteristics a printed all-SWNT-TFT at $V_{DS}$ of −20 V.

FIG. 1 shows a schematic of an exemplary process of fabricating SWNT TFTs using a commercial ink-jet printer for the electrode and active layer printing. FIG. 2 shows I-V characteristics of a printed all-SWNT-TFT FIG. 3 shows the corresponding transfer characteristics at $V_{DS}$ of −20 V.

Example 2 (Prophetic Example)

Figure 4:
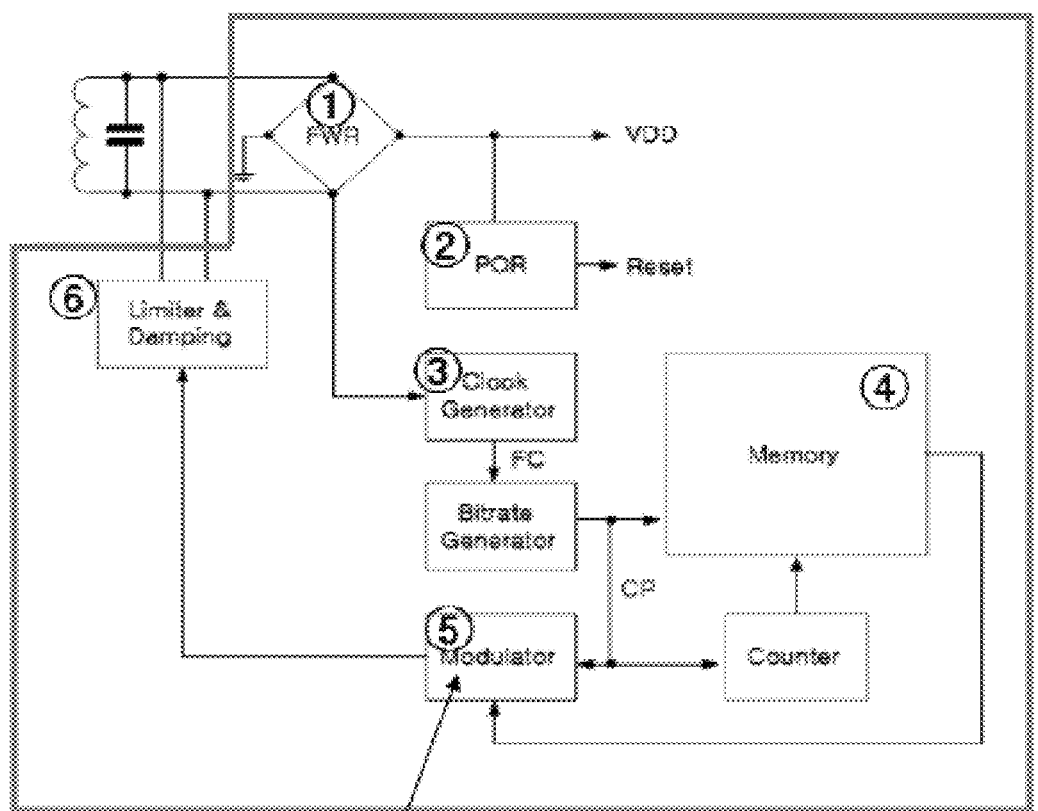
FIG. 4 depicts a radio-frequency identification (RFID) tag layout, in accordance with some embodiments of the present invention.
Figure 5:
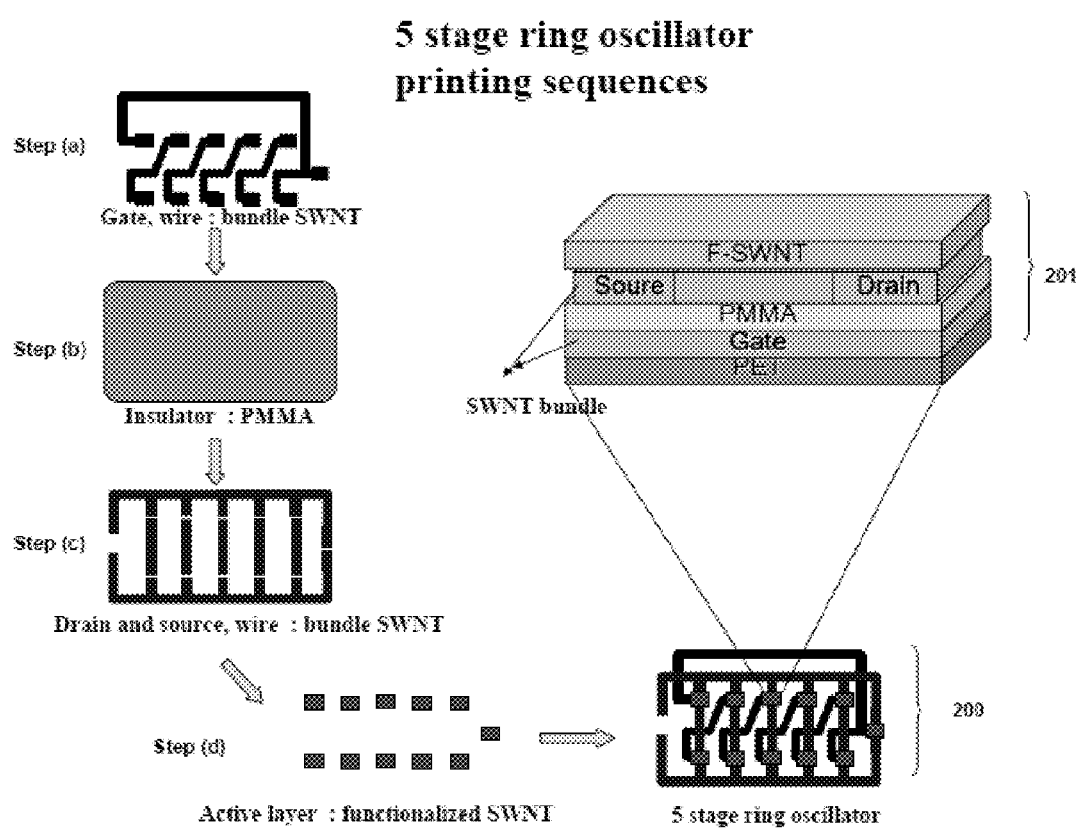
FIG. 5 schematically depicts a printing sequence for the fabrication of a 5-stage ring oscillator, the role of which is depicted in FIG. 4.
Figure 6:
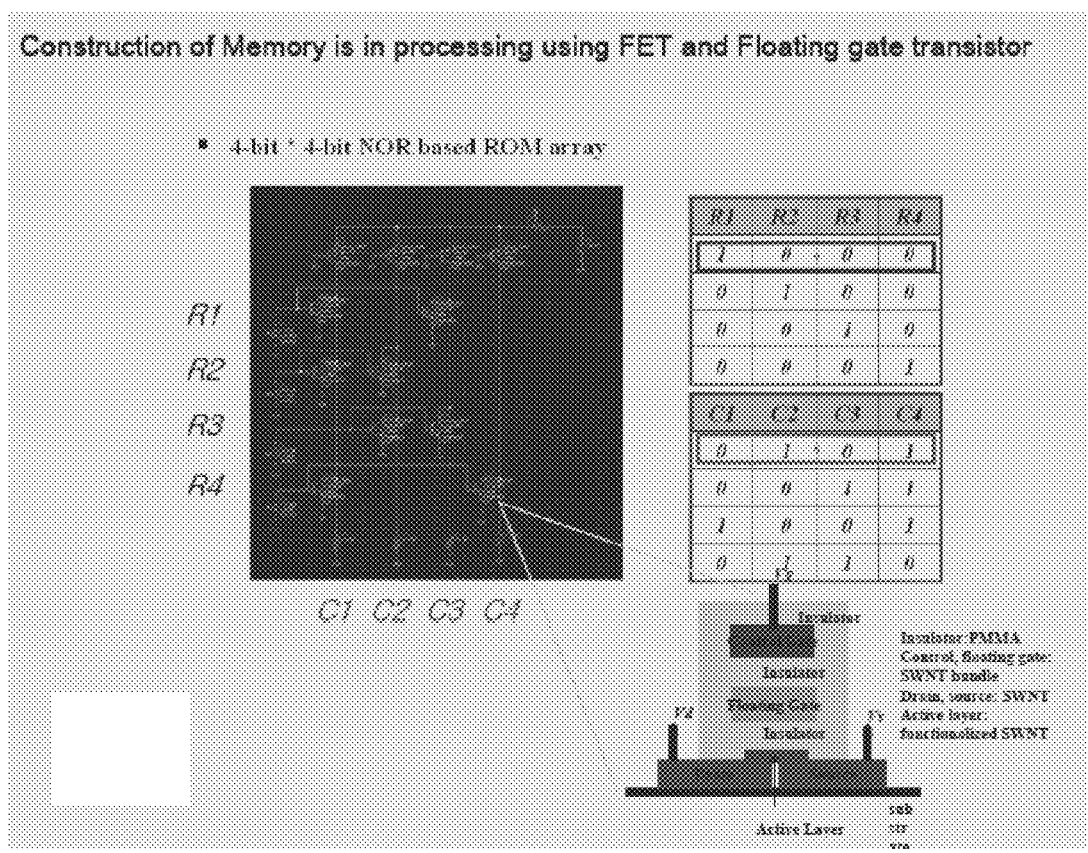
FIG. 6 depicts the construction of memory using FET and floating gate transistor.

RFID TAG: Regarding RFID tags, FIG. 4 illustrates the layout of an exemplary multi-component RFID tag, where one component is a modulator (5), the modulator comprising a ring oscillator, and another component is memory (4) (see, e.g., FIG. 6). In some embodiments, the ring oscillator is fabricated by printing layers, as shown in FIG. 5, where a layer of gates and associated wires, all of SWNT bundles, are printed on a substrate, as shown in Step (a); an insulating layer (e.g., PMMA) is deposited, as shown in Step (b); a source and drain layer, together with the associated wiring, all of bundled SWNTs, is put down (i.e., printed) on the insulating layer, as shown in Step (c); and an active layer is put down on the source and drain layer, wherein the active layer comprises functionalized SWNTs. These steps lead to the formation of 5-stage ring oscillator 200 comprising layered elements 201. Those of skill in the art will recognize that the other RFID tag components can be fabricated (i.e., printed) in similar fashion.

Example 3

Figure 7:
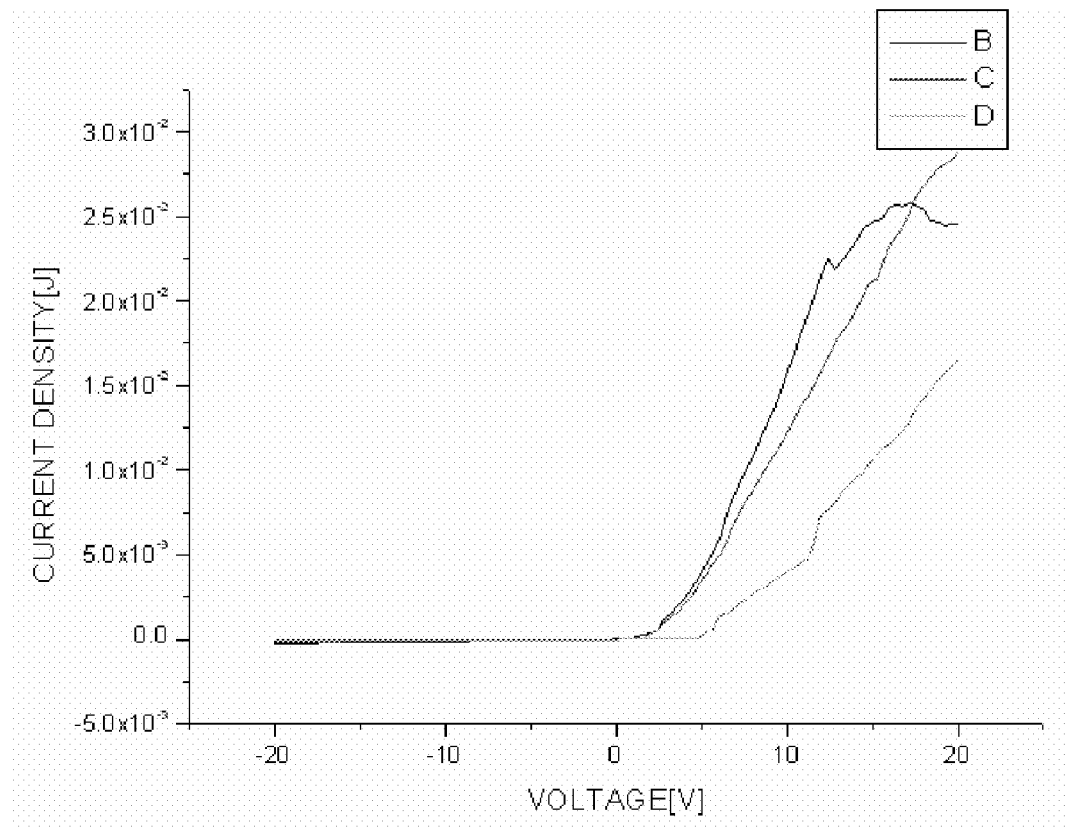
FIG. 7 illustrates the I-V characteristics of a SWNT-diode where line B shows results for $2^{nd}$ printing of SWNT; line C shows results for the $3^{rd}$ printing of SWNT; and line D shows results for the $4^{th}$ printing of SWNT.

SWNT DIODE: We have developed a SWNT-diode to construct a rectifier for providing DC power to a printed RFID tag. A SWNT-diode was prepared using the present printing method. First, an Au electrode was printed on a PET substrate using Au ink and an inkjet printer. On the printed Au electrode, PEDOT was printed on the pattern of printed Au. Selectively functionalized SWNT ink to knock out metallic SWNT was then printed on the PEDO patterns, and then finally a Ag electrode was printed on the SWNT patterns using Ag ink. The resulting SWNT-Diode was characterized using a semiconductor analyzer. The characteristics of the SWNT-diode are shown in FIG. 7.

Example 4 (Prophetic Example)

RECTIFIER: The present inventors contemplate the following example. A conventional printed 13.56 MHz antenna is coupled to have 4 V AC, and then rectified using a SWNT-diode to give 2 V DC using a conventional rectifier circuit.

Example 5

DIELECTRIC POLYMER WRAPPED SWNT: Using SDS stabilized SWNT solution, we just added monomer such as styrene and polymerized in situ using AIBN at 60° C. The resulting polystyrene (PS) wrapped SWNT could be used directly as active ink to print thin film transistor. A dielectric polymer wrapped SWNT is also described in Korean patent application No. 10-2006-0106023.

Figure 8:
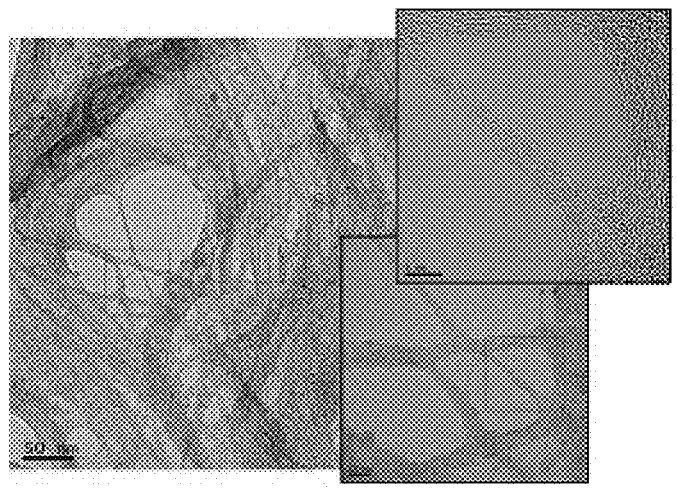
FIG. 8 is a TEM image of polystyrene wrapped SWNT.

PS wrapped SWNT was characterized using TEM. 2 to 5 nm thick PS was coated on SWNT, as illustrated by the TEM image shown in FIG. 8.

All patents and publications referenced herein are hereby incorporated by reference. It will be understood that certain of the above-described structures, functions, and operations of the above-described embodiments are not necessary to practice the present invention and are included in the description simply for completeness of an exemplary embodiment or embodiments. In addition, it will be understood that specific structures, functions, and operations set forth in the above-described referenced patents and publications can be practiced in conjunction with the present invention, but they are not essential to its practice. It is therefore to be understood that the invention may be practiced otherwise than as specifically described without actually departing from the spirit and scope of the present invention as defined by the appended claims.

What is claimed is:

1. A thin film transistor (TFT) comprising:
    a channel fabricated as a first layer of a composite ink mixture comprising metallic carbon nanotubes (m-NTs) and semiconductor carbon nanotubes (s-NTs) applied to a substrate,
        wherein the m-NTs dominate the characteristics of the composite ink mixture and are de-activated in-situ to render the channel a semiconductor channel layer;
    a gate area fabricated by applying a dielectric layer over a portion of the semiconductor channel layer while exposing a source area and a drain area on the semiconductor channel layer; and
    a gate electrode, a source electrode and a drain electrode fabricated as electrode layers of the composite ink mixture respectively applied to the gate area, the source area, and the drain area,
        wherein the m-NTs of the composite ink mixture of the electrode layers are not de-activated thus rendering the electrode layers of the composite ink mixture substantially conductive, and
        wherein a conductivity of the channel is modulated in response to a voltage applied to the gate electrode.

2. The TFT of claim 1, wherein the metallic carbon nanotubes and semiconductor carbon nanotubes are selected from the group consisting of single wall carbon nanotubes, multi-wall carbon nanotubes, double-wall carbon nanotubes, small-diameter carbon nanotubes, and combinations thereof.

3. A method for fabricating a thin film transistor (TFT), said method comprising:
    using an ink jet printer mechanism to print a substantially rectangular channel of the TFT as a composite ink mixture of metallic carbon nanotubes (m-NTs) and semiconductor carbon nanotubes (s-NTs),
        wherein the m-NTs are active and dominate the characteristics of the composite ink mixture;
    drying the composite ink mixture forming the rectangular channel;
    washing, if necessary, the composite ink mixture forming the rectangular channel to remove any unwanted residue present;
    de-activating the m-NTs in the composite ink mixture rendering the rectangular channel a semiconductor channel;
    applying a dielectric material over a portion of the semiconductor channel exposing a source area at one end of the semiconductor channel and a drain area at the other end of the semiconductor channel;
    printing electrodes of the composite ink mixture forming a gate electrode over the dielectric, a source electrode over the source area of the semiconductor channel, and a drain electrode over the drain area of the semiconductor channel;
    drying the composite ink mixture forming the gate electrode, source electrode, and drain electrode of the TFT; and
    washing, if necessary, the composite ink mixture forming the gate electrode, source electrode, and drain electrode of the TFT to remove any present unwanted residue.

4. The method of claim 3, wherein the metallic carbon nanotubes and semiconductor carbon nanotubes are selected from the group consisting of single wall carbon nanotubes, multi-wall carbon nanotubes, double-wall carbon nanotubes, small-diameter carbon nanotubes, and combinations thereof.

* * * * *